United States Patent
Kim

(10) Patent No.: US 10,491,216 B2
(45) Date of Patent: Nov. 26, 2019

(54) TERMINATION CIRCUIT, SEMICONDUCTOR DEVICE AND OPERATING METHOD THEREOF

(71) Applicant: SK hynix Inc., Gyeonggi-do (KR)

(72) Inventor: Kwang-Soon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/182,862

(22) Filed: Nov. 7, 2018

(65) Prior Publication Data

US 2019/0319621 A1 Oct. 17, 2019

(30) Foreign Application Priority Data

Apr. 17, 2018 (KR) .................. 10-2018-0044356

(51) Int. Cl.
*H03K 19/00* (2006.01)
*G11C 29/50* (2006.01)
*H03K 19/20* (2006.01)

(52) U.S. Cl.
CPC ... *H03K 19/0005* (2013.01); *G11C 29/50008* (2013.01); *H03K 19/20* (2013.01)

(58) Field of Classification Search
CPC ............. H03K 19/0005; H03K 19/20; G11C 29/50008
USPC .......................................................... 326/30
See application file for complete search history.

(56) References Cited

U.S. PATENT DOCUMENTS

| | | | |
|---|---|---|---|
| 2006/0158198 A1* | 7/2006 | Fujisawa | G11C 29/02 324/601 |
| 2011/0128038 A1* | 6/2011 | Ko | G11C 7/02 326/30 |
| 2011/0291698 A1* | 12/2011 | Ko | H03K 19/017545 326/30 |
| 2013/0162286 A1* | 6/2013 | Lee | H03K 19/00315 326/30 |
| 2017/0162238 A1* | 6/2017 | Lee | G06F 3/0608 |
| 2017/0168746 A1* | 6/2017 | Kwon | G06F 3/0604 |

FOREIGN PATENT DOCUMENTS

| | | |
|---|---|---|
| KR | 1020050019453 | 3/2005 |
| KR | 1020100025843 | 3/2010 |

* cited by examiner

*Primary Examiner* — Don P Le
(74) *Attorney, Agent, or Firm* — IP & T Group LLP

(57) ABSTRACT

A semiconductor device includes a calibration circuit suitable for generating impedance control codes based on an external resistor coupled to a calibration pad; an individual trimming controller suitable for generating a plurality of individual trimming signals based on test mode signals and group selection signals; and a termination circuit including a plurality of resistor groups, coupled in parallel to a data pad, that are trimmed as a group based on the impedance control codes, each of the plurality of resistor groups being individually trimmed based on a corresponding signal among the plurality of individual trimming signals.

20 Claims, 12 Drawing Sheets

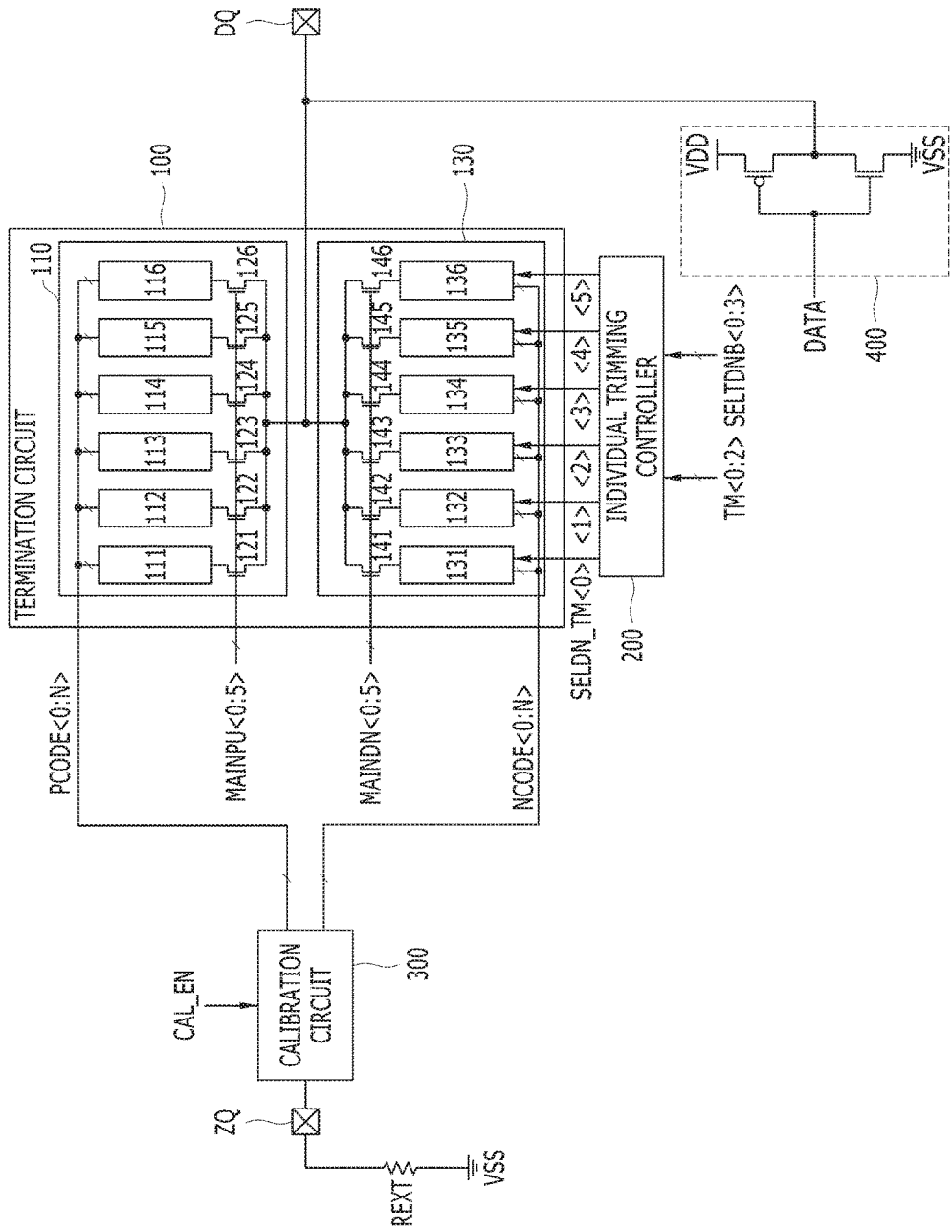

TERMINATION CIRCUIT, SEMICONDUCTOR DEVICE AND OPERATING METHOD THEREOF

CROSS-REFERENCE TO RELATED APPLICATION

This application claims priority under 35 U.S.C. § 119(a) to Korean Patent Application No. 10-2018-0044356, filed on Apr. 17, 2018, the disclosure of which is incorporated herein by reference in its entirety.

BACKGROUND

1. Field

Various embodiments of the present invention relate to a semiconductor design technique, and more particularly, to a semiconductor device that performs an on-die termination operation and an operating method of the same.

2. Description of the Related Art

In semiconductor devices, the swing width of signals is decreasing so as to minimize a transmission time of signals interfacing between semiconductor devices. As the swing width of the signals decreases, an effect of external noise on the semiconductor devices increases, and signal reflection that may be caused by impedance mismatching in an interface becomes a serious issue. If impedance mismatch occurs, it may be difficult to transmit data at a high speed, and data output from an output terminal of a semiconductor device may be distorted. Accordingly, since the semiconductor device receiving the data receives a distorted output signal, concerns such as a setup/hold failure, misjudgment, or the like may frequently occur.

In order to address these concerns, semiconductor devices required to operate at a high speed include an impedance matching circuit, which is called an on-die termination circuit, installed adjacent to a pad within an integrated circuit (IC) chip. In general, for on-die termination schemes between a transmitter and a receiver, a source termination is performed by an output circuit in the transmitter, and a parallel termination is performed by a termination circuit that is coupled in parallel to an input circuit coupled to an input pad in the receiver. Signal integrity (SI) characteristics may be improved by an on-die termination device.

SUMMARY

Various embodiments of the present invention are directed to a semiconductor device that may individually or collectively trim resistor groups of a termination circuit, and an operating method of the semiconductor device.

In accordance with an embodiment of the present invention, a semiconductor device includes: a calibration circuit suitable for generating impedance control codes based on an external resistor coupled to a calibration pad; an individual trimming controller suitable for generating a plurality of individual trimming signals based on test mode signals and group selection signals; and a termination circuit including a plurality of resistor groups, coupled in parallel to a data pad, that are trimmed as a group based on the impedance control codes, each of the plurality of resistor groups being individually trimmed based on a corresponding signal among the plurality of individual trimming signals.

In accordance with an embodiment of the present invention, a termination circuit includes: a pull-up termination block including a plurality of pull-up resistor groups that are coupled in parallel to each other between a data pad and a terminal for a power source voltage and are trimmed as a group based on pull-up control codes; and a pull-down termination block including a plurality of pull-down resistor groups that are coupled in parallel to each other between the data pad and a terminal for a ground voltage and are trimmed as a group based on pull-down control codes, each of the plurality of pull-down resistor groups being individually trimmed based on a corresponding signal among a plurality of individual trimming signals.

In accordance with an embodiment of the present invention, a termination circuit includes: a pull-up termination block including a plurality of pull-up resistor groups that are coupled in parallel to each other between a data pad and a terminal for a power source voltage and are trimmed based on pull-up control codes; and a pull-down termination block including a plurality of pull-down resistor groups that are coupled in parallel to each other between the data pad and a terminal for a ground voltage and are trimmed based on pull-down control codes, wherein one or more resistor groups selected from the pull-up and pull-down termination blocks are individually trimmed based on one or more corresponding signals among a plurality of individual trimming signals.

In accordance with an embodiment of the present invention, a termination circuit includes: a first terminal coupled to a power source voltage; a second terminal coupled to a ground voltage; a data pad; a pull-up termination block, coupled between the first terminal and the data pad, including a plurality of pull-up resistor groups and a plurality of pull-up switches, the plurality of pull-up resistor groups coupled in parallel between the first terminal and a first node, and the plurality of pull-up switches coupled in parallel between the first node and the data pad; and a pull-down termination block, coupled between the data pad and the second terminal, including a plurality of pull-down switches and a plurality of pull-down resistor groups, the plurality of pull-down switches coupled in parallel between the data pad and a second node, and the plurality of pull-down resistor groups coupled in parallel between the second node and the first terminal, wherein the plurality of pull-down switches are turned on in response to pull-down target signals, wherein each of the plurality of pull-down resistor groups includes: a plurality of pull-down switching elements being simultaneously switched on or off in response to pull-down control codes; and an additional pull-down switching element being switched on or off in response to individual trimming signals.

BRIEF DESCRIPTION OF THE DRAWINGS

FIG. 4 is a block diagram illustrating a memory device in accordance with an embodiment of the present invention.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention. Also, throughout the specification, reference to "an embodiment" or the like is not necessarily to only one embodiment, and different references to any such phrase are not necessarily to the same embodiment(s).

Moreover, it is noted that the terminology used herein is for the purpose of describing embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component. Communication between two components, whether directly or indirectly coupled/connected may be wired or wireless, unless the context indicates otherwise.

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the present invention.

The drawings are not necessarily to scale and, in some instances, proportions may have been exaggerated in order to clearly illustrate features of the embodiments.

A memory device is described as an example of a semiconductor device, but the present invention is not limited to a memory device. Rather, the invention also may be applied to various other semiconductor devices.

Figure 1:
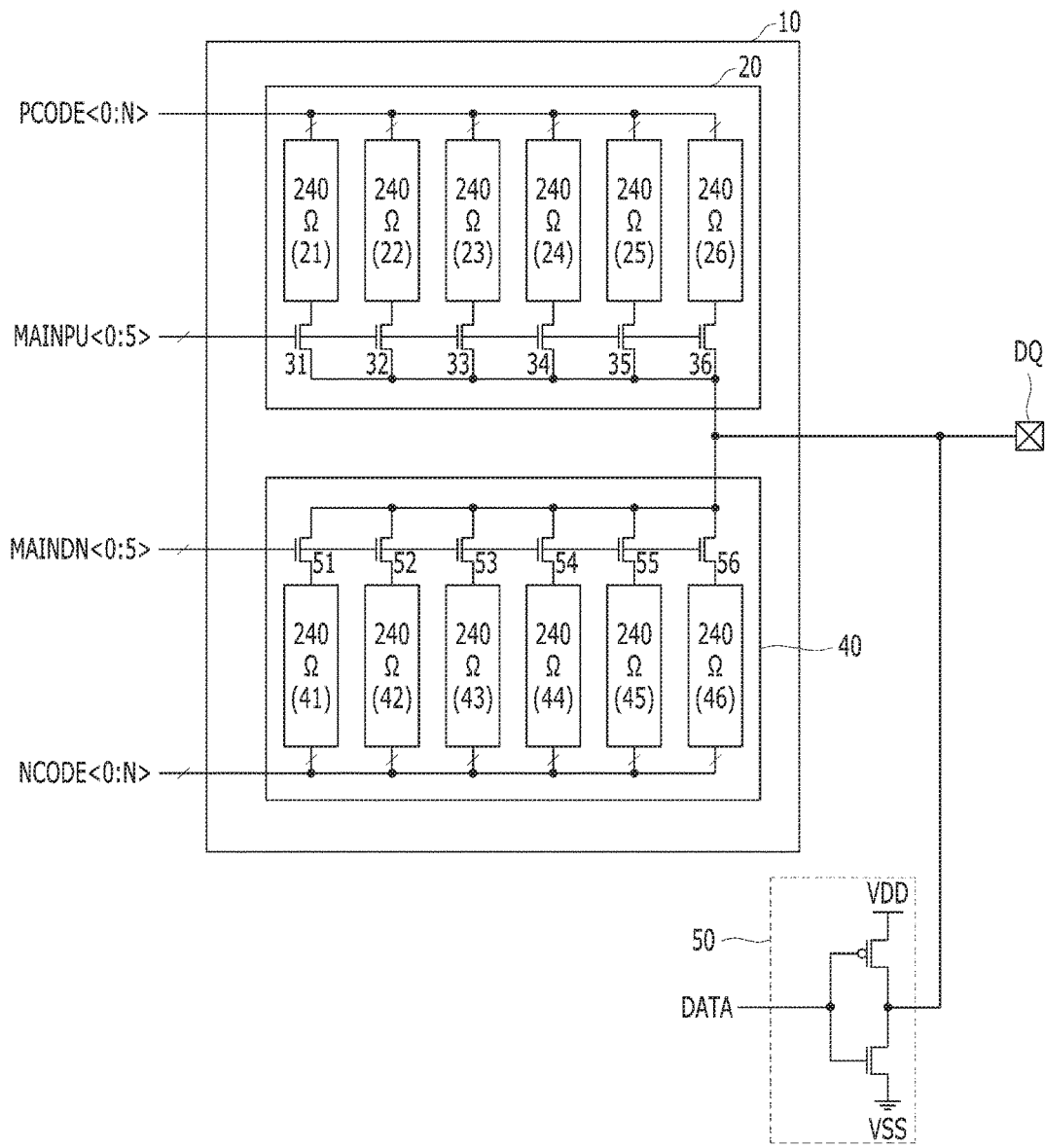
FIG. 1 is a block diagram illustrating a general memory device including a termination circuit and an output driver.

FIG. 1 is a block diagram illustrating a general memory device including a termination circuit 10 and an output driver 50.

Referring to FIG. 1, the termination circuit 10 includes a pull-up termination block 20 and a pull-down termination block 40 which match impedance between a data pad DQ and an external device (not illustrated).

The pull-up termination block 20 includes a plurality of resistor groups, for example, first to sixth pull-up resistor groups 21 to 26. Each of first to sixth pull-up resistor groups 21 to 26 may include a plurality of resistors (not illustrated) coupled in parallel to each other. The first to sixth pull-up resistor groups 21 to 26 may be trimmed or adjusted to have a specific target resistance value, for example, "240Ω", based on pull-up control codes PCODE<0:N>. The resistance trimming of the pull-up resistor groups 21 to 26 may be done simultaneously. The pull-up termination block 20 may further include first to sixth pull-up coupling units 31 to 36. The first to sixth pull-up coupling units 31 to 36 may be turned on and off (on/off) based on a corresponding signal among first to sixth pull-up target signals MAINPU<0:5>. Each of the first to sixth pull-up coupling units 31 to 36 couples a corresponding pull-up resistor group to the data pad DQ. In other words, pull-up impedance of the pull-up termination block 20 may decrease to 240Ω, 120Ω, 80Ω, 60Ω, 48Ω and 405Ω as each of the first to sixth pull-up target signals MAINPU<0:5> is activated.

The pull-down termination block 40 includes a plurality of resistor groups, for example, first to sixth pull-down resistor groups 41 to 46. Each of the first to sixth pull-down resistor groups 41 to 46 may include a plurality of resistors (not illustrated) coupled in parallel to each other. The first to sixth pull-down resistor groups 41 to 46 may be trimmed or adjusted to have a specific target resistance value, for example, "240Ω", based on pull-down control codes NCODE<0:N>. The resistance trimming of the pull-down resistor groups 41 to 46 may be done simultaneously. The pull-down termination block 40 may further include first to sixth pull-down coupling units 51 to 56. The first to sixth pull-down coupling units 51 to 56 may be turned on/off based on a corresponding signal among first to sixth pull-down target signals MAINDN<0:5>. Each of the first to sixth pull-down coupling units 51 to 56 couples a corresponding pull-down resistor group to the data pad DQ. In other words, pull-down impedance of the pull-down termination block 40 may decrease to 240Ω, 120Ω, 80Ω, 60Ω, 48Ω and 40Ω as each of the first to sixth pull-down target signals MAINDN<0:5> is activated.

The output driver 50 drives data DATA and outputs the data DATA to the data pad DQ. When the output driver 50 drives the data DATA, impedance match between the memory device and the external device (not illustrated) may occur due to the total or overall impedance of the termination circuit 10, which is determined based on the pull-up impedance and the pull-down impedance.

Figure 2A:
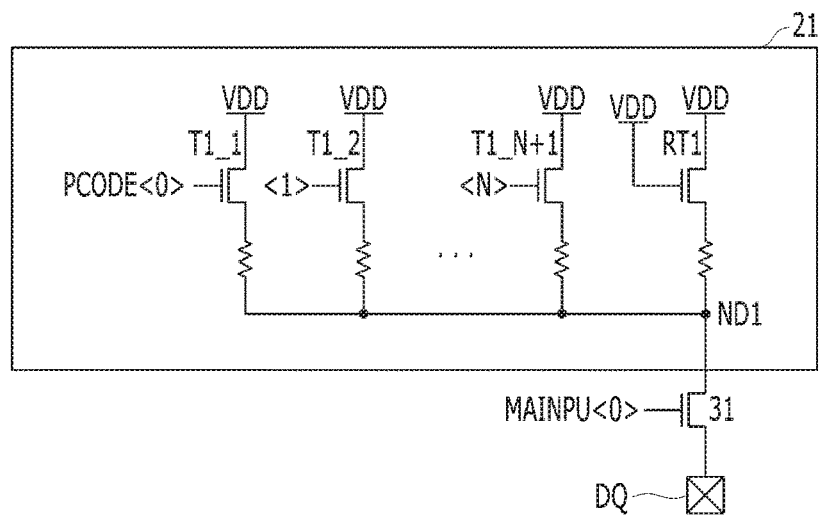
FIG. 2A is a circuit diagram illustrating a first pull-up resistor group shown in FIG. 1.

FIG. 2A is a circuit diagram illustrating the first pull-up resistor group 21 shown in FIG. 1. Each of the second to sixth pull-up resistor groups 22 to 26 may have substantially the same structure as the first pull-up resistor group 21.

Referring to FIG. 2A, the first pull-up resistor group 21 includes a plurality of resistors and a plurality of transistors, which are coupled in parallel between a terminal for a power source voltage VDD and a first node ND1. The first pull-up coupling unit 31 may couple the first node ND1 to the data pad DQ based on the first pull-up target signal MAINPU<0>. The plurality of transistors may include (N+1) trimming transistors T1_1 to T1_N+1 and a reference transistor RT1. The (N+1) trimming transistors T1_1 to T1_N+1 are turned on/off depending on corresponding bits of the pull-up control codes PCODE<0:N>. The reference transistor RT1 is turned on all the time after a power-up mode. In other words, after a reference resistance value is formed by the reference transistor RT1, the reference resistance value may be trimmed to a target resistance value by the trimming transistors T1_1 to T1_N+1.

Figure 2B:
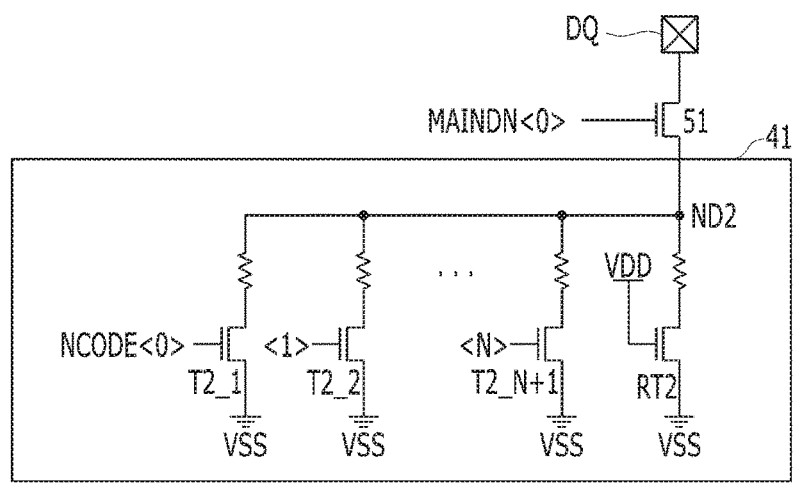
FIG. 2B is a circuit diagram illustrating a first pull-down resistor group shown in FIG. 1.

FIG. 2B is a circuit diagram illustrating the first pull-down resistor group 41 shown in FIG. 1. Each of the second to sixth pull-down resistor groups 42 to 46 may have substantially the same structure as the first pull-down resistor group 41.

Referring to FIG. 2B, the first pull-down resistor group 41 includes a plurality of resistors and a plurality of transistors, which are coupled in parallel between a terminal for a ground voltage VSS and a second node ND2. The first pull-down coupling unit 51 may couple the second node ND1 to the data pad DQ based on the first pull-down target signal MAINDN<O>. The plurality of transistors may include (N+1) trimming transistors T2_1 to T2_N+1 and a reference transistor RT2. The (N+1) trimming transistors T2_1 to T2_N+1 are turned on/off depending on corresponding bits of the pull-down control codes NCODE<0:N>. The reference transistor RT2 remains turned on after the power-up mode. In other words, after a reference resistance value is formed by the reference transistor RT2, the reference resistance value may be trimmed to a target resistance value by the trimming transistors T2_1 to T2_N+1.

Pull-up impedance and pull-down impedance may vary according to variations in process, voltage and temperature (PVT). Particularly, a resistance value of a transistor may vary due to the variation in the process. The variations in the pull-up impedance and the pull-down impedance may cause variations in the total impedance of the termination circuit 10, and hence the total impedance of the termination circuit 10 may not be intended target impedance. Additionally, as the numbers of the pull-up coupling units and pull-down coupling units which are activated increase, that is, the number of selected resistor groups increases, a mismatch ratio of impedance of the pull-up termination block 20 and pull-down termination block 40 to the target impedance increases due to parasitic resistance and leakage current components.

Figure 3:
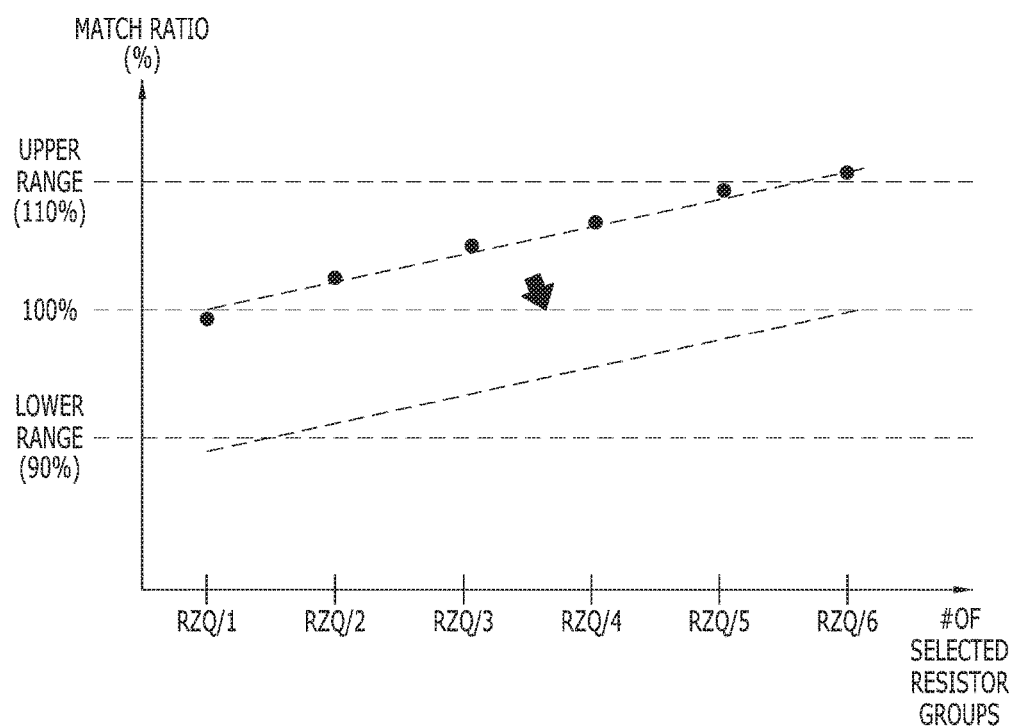
FIG. 3 is a graph showing a match ratio of pull-down impedance to target impedance.

FIG. 3 is a graph showing a match ratio of pull-up or pull-down impedance to target impedance. Hereinafter, the match ratio of the pull-down impedance to the target impedance is described as an example.

Referring to FIG. 3, the x-axis denotes the number of selected pull-down resistor groups. The reference symbol "RZQ/1" denotes a case where any one of the first to sixth pull-down coupling units 51 to 56 (shown in FIG. 1) is activated. In this case, the target impedance may be 240Ω. Similarly, the reference symbol "RZQ/6" denotes a case where all the first to sixth pull-down coupling units 51 to 56 are activated. In this case, the target impedance may be 40Ω. The y-axis denotes the match ratio of actual pull-down impedance to the target impedance as a percentage. In other words, the y-axis denotes a ratio of the actual pull-down impedance to the target impedance 240Ω in case of RZQ/1 and a ratio of the actual pull-down impedance to the target impedance 40Ω in case of RZQ/6.

As the number of resistor groups coupled in parallel to each other increases due to the parasitic resistance and leakage current components generated in a layout, impedance mismatch also increases. As shown in FIG. 3, it may be seen that RZQ/1 is closest to the target impedance, and RZQ/6 is farthest from the target impedance. A ratio of the actual impedance to the target impedance of 110% may be defined as an upper range, and a ratio of the actual impedance to the target impedance of 90% may be defined as a lower range, as shown in FIG. 3. With those upper and lower ranges, RZQ/6 is out of the upper range, as shown in FIG. 3.

To improve the situation, the pull-up control codes PCODE<0:N> and the pull-down control codes NCODE<0:N> may be adjusted so that the trimming transistors T1_1 to T1_N+1 and T2_1 to T2_N+1 of the respective resistor groups may be controlled. However, since all the resistor groups are collectively, i.e., simultaneously trimmed according to the pull-up control codes PCODE<0:N> and the pull-down control codes NCODE<0:N>, the impedances of all of the RZQs are moved as shown in FIG. 3. Therefore, there is a limit in controlling the trimming in the termination circuit 10 of FIG. 1.

Below, a method of individually trimming the respective resistor groups of the termination circuit 10 will be described in accordance with embodiments of the present invention.

A ZQ calibration operation refers to a process of generating impedance control codes, i.e., the pull-up control codes PCODE<0:N> and the pull-down control codes NCODE<0:N>, that vary according to variations in process, voltage and temperature (PVT). Impedance of a termination circuit is adjusted using the impedance control codes generated as a result of the ZQ calibration operation. In general, a pad to which an external resistor is coupled as a reference for calibration refers to a calibration pad ZQ. For this reason, the term of "ZQ calibration" is mainly used.

A calibration circuit that generates the impedance control codes and a termination circuit that terminates input and/or output nodes using the impedance control codes are described below.

FIG. 4 is a block diagram illustrating a memory device in accordance with an embodiment of the present invention.

Referring to FIG. 4, the memory device may include a termination circuit 100, an individual trimming controller 200, a calibration circuit 300, and an output driver 400.

The termination circuit 100 may include a pull-up termination block 110 and a pull-down termination block 130 which match is impedance between a data pad DQ and an external device (not illustrated).

The pull-up termination block 110 may include a plurality of resistor groups, for example, first to sixth pull-up resistor groups 111 to 116. Each of the first to sixth pull-up resistor groups 111 to 116 may include a plurality of resistors (not illustrated) coupled in parallel to each other. The first to sixth pull-up resistor groups 111 to 116 may be simultaneously trimmed to have a specific target resistance value, for example, 240Ω, based on pull-up control codes PCODE<0:N>. The pull-up termination block 110 may further include first to sixth pull-up coupling units 121 to 126. Each of the first to sixth pull-up coupling units 121 to 126 may be turned on and off (on/off) based on a corresponding signal among first to sixth pull-up target signals MAINPU<0:5>. Each of the first to sixth pull-up coupling units 121 to 126 may couple a corresponding pull-up resistor group to the data pad DQ. In other words, pull-up impedance of the pull-up termination block 110 may decrease to 240Ω, 120Ω, 80Ω, 60Ω, 48Ω and 405Ω as the number of pull-up coupling units that are turned on in response to the first to sixth pull-up target signals MAINPU<0:5> increases.

The pull-down termination block 130 may include a plurality of resistor groups, for example, first to sixth pull-down resistor groups 131 to 136. Each of the first to sixth pull-down resistor groups 131 to 136 may include a plurality of resistors (not illustrated) coupled in parallel to each other. The first to sixth pull-down resistor groups 131 to 136 may be simultaneously trimmed to have a specific target resistance value, for example, 240Ω, based on pull-down control codes NCODE<0:N>. In addition, each of the first to sixth pull-down resistor groups 131 to 136 may be individually trimmed based on a corresponding signal among a plurality of individual trimming signals SELDN_TM<0:5>. The individual trimming signals SELDN_TM<0:5> may be provided as many as the number of pull-down resistor groups. In other words, the first to sixth individual trimming signals SELDN_TM<0:5> corresponding to the first to sixth pull-down resistor groups 131 to 136 may be provided. For example, the first pull-down resistor group 131 is trimmed based on the first individual trimming signal SELDN_TM<0>, and the second pull-down resistor group 132 is trimmed based on the second individual trimming signal SELDN_TM<1>. In this manner, the sixth pull-down resistor group 136 may be trimmed based on the sixth individual trimming signal SELDN_TM<5>.

The pull-down termination block 130 may further include first to sixth pull-down coupling units 141 to 146. Each of the first to sixth pull-down coupling units 141 to 146 may be turned on/off based on a corresponding signal among first to sixth pull-down target signals MAINDN<0:5>. Each of the first to sixth pull-down coupling units 141 to 146 may couple a corresponding pull-down resistor group to the data pad DQ. In other words, pull-down impedance of the pull-down termination block 130 may decrease to 240Ω, 120Ω, 80Ω, 60Ω, 48Ω and 405Ω as the number of pull-down coupling units that are turned on in response to the first to sixth pull-down target signals MAINDN<0:5> increases.

The individual trimming controller 200 may generate the first to sixth individual trimming signals SELDN_TM<0:5> whose activation counts are adjusted based on test mode signals TM<0:2> and group selection signals SELTDNB<0:3>. The test mode signals TM<0:2> are for selecting pull-down resistor group(s) to be trimmed. For example, when there is no pull-down resistor group to be individually trimmed, the test mode signals TM<0:2> may be set to '001'. In this case, '1' may correspond to a first bit TM<0> of the test mode signals TM<0:2>, and '0' may correspond to a second bit TM<1> and a third bit TM<2>. When there is a single pull-down resistor group, for example, the sixth pull-down resistor group 136, to be individually trimmed, the test mode signals TM<0:2> may be set to '010'. In this manner, when all the first to sixth pull-down resistor groups 131 to 136 are to be trimmed, the test mode signals TM<0:2> may be set to '111'. The group selection signals SELTDNB<0:3> are for selecting at least one of the first to sixth pull-down resistor groups 131 to 136 according to target impedance.

The calibration circuit 300 may be coupled between a calibration pad ZQ of the memory device and the termination circuit 100. The calibration circuit 300 may operate when a calibration enable signal CAL_EN is activated. The calibration circuit 300 may generate the pull-up control codes PCODE<0:N> and pull-down control codes NCODE<0:N> for controlling impedance of the termination circuit 100 using an external resistor REXT, for example, 240Ω, coupled to the calibration pad ZQ.

The output driver 400 may drive data DATA and output the data DATA to the data pad DQ.

Accordingly, when the output driver 400 drives the data DATA, impedance match between the memory device and the external device (not illustrated) may occur due to the total impedance of the termination circuit 100, which is determined based on the pull-up impedance and the pull-down impedance.

According to embodiments of the present invention, the termination circuit 100 may be implemented to serve as the output driver 400. In other words, the termination circuit 100 may pull-up drive the pull-up termination block 110 to output logic high data or may pull-down drive the pull-down termination block 130 to output logic low data, depending on the data. In this case, the termination circuit 100 may further include a pre-driver (not shown) disposed in front of the pull-up termination block 110 and the pull-down termination block 130. The pre-driver may receive the data, the pull-up control codes PCODE<0:N> and the pull-down control codes NCODE<0:N> to pull-up drive the pull-up termination block 110 or pull-down drive the pull-down termination block 130.

Although it is illustrated in FIG. 4 that each of the pull-up termination block 110 and the pull-down drive the pull-down termination block 130 includes six resistor groups, the present invention is not limited thereto; more or fewer resistor groups may be included. In addition, although it is described in FIG. 4 that the individual trimming controller 200 controls only the pull-down termination block 130, the individual trimming controller 200 may control only the pull-up termination block 110 according to embodiments of the present invention. In this case, each of the first to sixth pull-up resistor groups 111 to 116 may be individually trimmed based on a corresponding signal among a plurality of individual trimming signals. According to embodiments, the individual trimming controller 200 may control both of the pull-up termination block 110 and the pull-down termination block 130. Each of the first to sixth pull-up resistor groups 111 to 116 may be individually trimmed based on a corresponding signal among the plurality of individual trimming signals, and each of the first to sixth pull-down resistor groups 131 to 136 may be individually trimmed based on a corresponding signal among the first to sixth individual trimming signals SELDN_TM<0:5>.

Furthermore, the termination circuit 100 may be configured to include only the pull-up termination block 110 or to include only the pull-down termination block 130 depending on the particular termination scheme. In addition, more than one pull-up termination block 110 and/or pull-down termination block 130 may be provided depending on the number of data pads DQ.

Figure 5A:
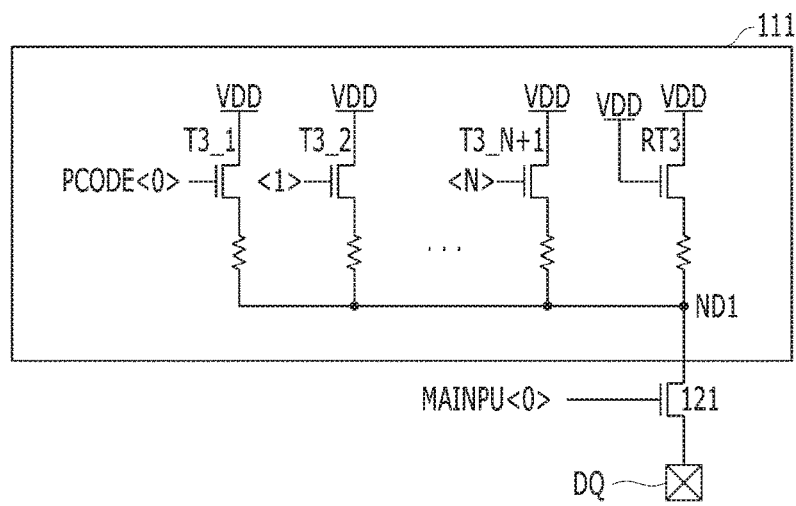
FIG. 5A is a circuit diagram illustrating a first pull-up resistor group in accordance with an embodiment of the present invention.

FIG. 5A is a circuit diagram illustrating a first pull-up resistor group in accordance with an embodiment of the present invention, for example, the first pull-up resistor group 111 shown in FIG. 4.

Referring to FIG. 5A, the first pull-up resistor group 111 may include a plurality of resistors and a plurality of transistors, which are coupled in parallel between a terminal for a power source voltage VDD and a first node ND1. Since the plurality of transistors operate as active loads having internal resistance components, the plurality of resistors may be omitted. In this case, the resistor in the present invention may refer to the transistor.

The plurality of transistors may include (N+1) first trimming transistors T3_1 to T3_N+1 and a reference transistor RT3. The first trimming transistors T3_1 to T3_N+1 may be turned on/off depending on corresponding bits of the pull-up control codes PCODE<0:N>. The reference transistor RT3 may remain turned on after a power-up mode. In other words, after a reference resistance value is formed by the reference transistor RT3, the reference resistance value may be trimmed to a target resistance value by the first trimming transistors T3_1 to T3_N+1. The first to sixth pull-up resistor groups 111 to 116 may be simultaneously trimmed based on the pull-up control codes PCODE<0:N>.

Figure 5B:
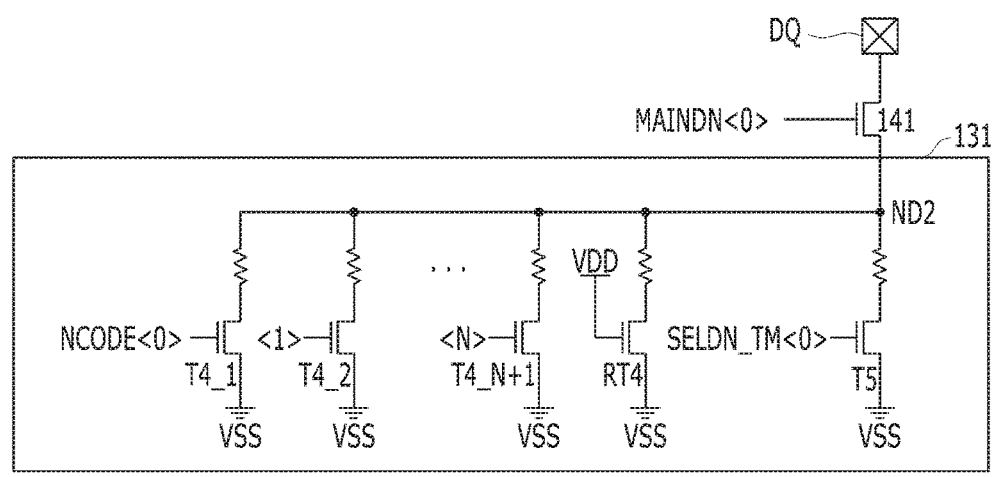
FIG. 5B is a circuit diagram illustrating a first pull-down resistor group in accordance with an embodiment of the present invention.

FIG. 5B is a circuit diagram illustrating a first pull-down resistor group in accordance with an embodiment of the present invention, for example, the first pull-down resistor group 131 shown in FIG. 4. Each of the second to sixth pull-down resistor groups 132 to 136 may have substantially the same structure as the first pull-down resistor group 131.

Referring to FIG. 5B, the first pull-down resistor group 131 may include a plurality of resistors and a plurality of transistors, which are coupled in parallel between a terminal for a ground voltage VSS and a second node ND2. Similarly to the first pull-up resistor group 111 shown in FIG. 5A, since the plurality of transistors operate as active loads having internal resistance components, the plurality of resistors may be omitted.

The plurality of transistors may include (N+1) second trimming transistors T4_1 to T4_N+1, a reference transistor RT4 and a third trimming transistor T5. The second trimming transistors T4_1 to T4_N+1 may be turned on/off depending on corresponding bits of the pull-down control codes NCODE<0:N>. The reference transistor RT4 may remain turned on after the power-up mode. The third trimming transistor T5 may be turned on/off based on the first individual trimming signal SELDN_TM<0>. In other words, after a reference resistance value is formed by the reference transistor RT4, the reference resistance value may be trimmed to a target resistance value by the second and third trimming transistors T4_1 to T4_N+1 and T5. The first pull-down resistor group 131 may be trimmed is simultaneously with the second to sixth pull-down resistor groups 132 to 136 based on the pull-down control codes NCODE<0:N>. The first pull-down resistor group 131 may be trimmed separately from the second to sixth pull-down resistor groups 132 to 136 based on the first individual trimming signal SELDN_TM<0>. That is, the first to sixth pull-down resistor groups 131 to 136 may be individually trimmed based on the first to sixth individual trimming signals SELDN_TM<0:5>, respectively.

The individual trimming controller 200 is described in further detail below with reference to drawings. Before describing detailed configurations of the individual trimming controller 200, the group selection signals SELTDNB<0:3> are described first with reference to FIG. 6.

Figure 6:
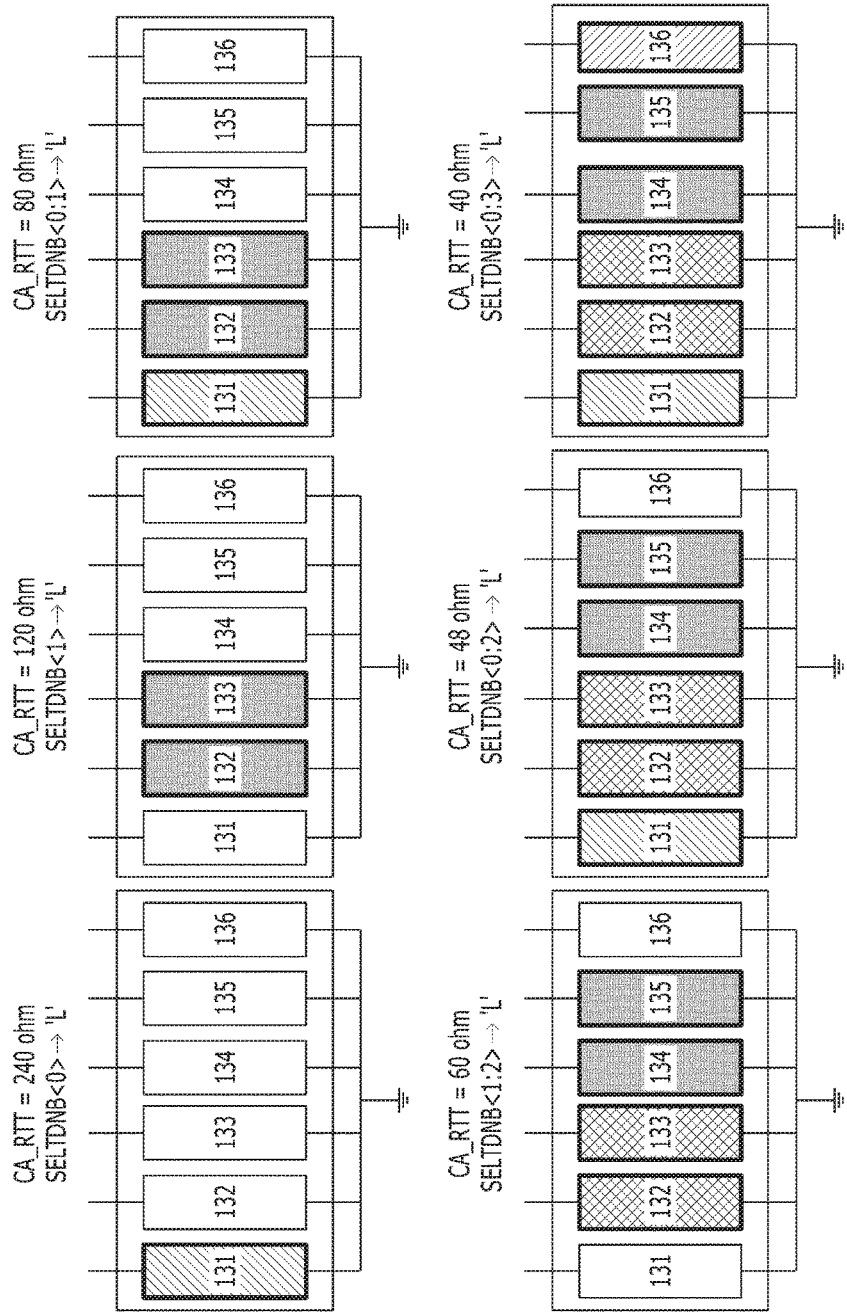
FIG. 6 is a diagram illustrating a group selection signal in accordance with an embodiment of the present invention.

FIG. 6 is a diagram illustrating group selection signals in accordance with an embodiment of the present invention, for example, the group selection signals SELTDNB<0:3> shown in FIG. 4.

Referring to FIG. 6, the group selection signals SELTDNB<0:3> are for selecting at least one of the first to sixth pull-down resistor groups 131 to 136 according to target impedance CA_RTT. When the group selection signals SELTDNB<0:3> are composed of 4 bits, any bit SELTDNB<#> having a value of a certain level (e.g., logic level 'L') of the group selection signals SELTDNB<0:3> may be defined as a signal for selecting the certain pull-down resistor group. The first bit SELTDNB<0> of the group selection signals SELTDNB<0:3> may be for selecting the first pull-down resistor group 131. The second bit SELTDNB<1> may be for selecting the second and third pull-down resistor groups 132 and 133. The third bit SELTDNB<2> may be for selecting the fourth and fifth pull-down resistor groups 134 and 135. The fourth bit SELTDNB<3> may be for selecting the sixth pull-down resistor group 136.

When the target impedance CA_RTT is 240 ohm[Q], the first bit SELTDNB<0> may be activated to select the first pull-down resistor group 131. When the target impedance CA_RTT is 120Ω, the second bit SELTDNB<1> may be activated to select the second and third pull-down resistor groups 132 and 133. When the target impedance CA_RTT is 80Ω, the first and second bits SELTDNB<0:1> may be activated to select the first to third pull-down resistor groups 131 to 133. When the target impedance CA_RTT is 60Ω, the second and third bits SELTDNB<1:2> may be activated to select the second to fifth pull-down resistor groups 132 to 135. When the target impedance CA_RTT is 48Ω, the first to third bits SELTDNB<0:2> may be activated to select the first to fifth pull-down resistor groups 131 to 135. When the target impedance CA_RTT is 40Ω, the first to fourth bits SELTDNB<0:3> may be activated to select the first to sixth pull-down resistor groups 131 to 136. The group selection signals SELTDNB<0:3> may be activated as a logic low level.

When the target impedance CA_RTT is 120Ω or 60Ω, the first to sixth pull-down resistor groups 131 to 136 may not be sequentially selected from the first pull-down resistor group 131. In other words, when the target impedance CA_RTT is 120Ω, the second and third pull-down resistor groups 132 and 133 in lieu of the first and second pull-down resistor groups 131 and 132 may be selected. When the target impedance CA_RTT is 60Ω, the second to fifth pull-down resistor groups 132 to 135 in lieu of the first to fifth pull-down resistor groups 131 to 135 may be selected. The first to sixth pull-down target signals MAINDN<0:5> may operate in the same manner as described above. In other words, when the target impedance CA_RTT is 60Ω, the second to fifth pull-down target signals MAINDN<1:4> may be activated.

Since the first to sixth pull-down resistor groups 131 to 136 are not sequentially selected from the first pull-down resistor group 131 as described above, the individual trimming controller 200 in accordance with an embodiment of the preset invention may include a subtractor.

Figure 7:
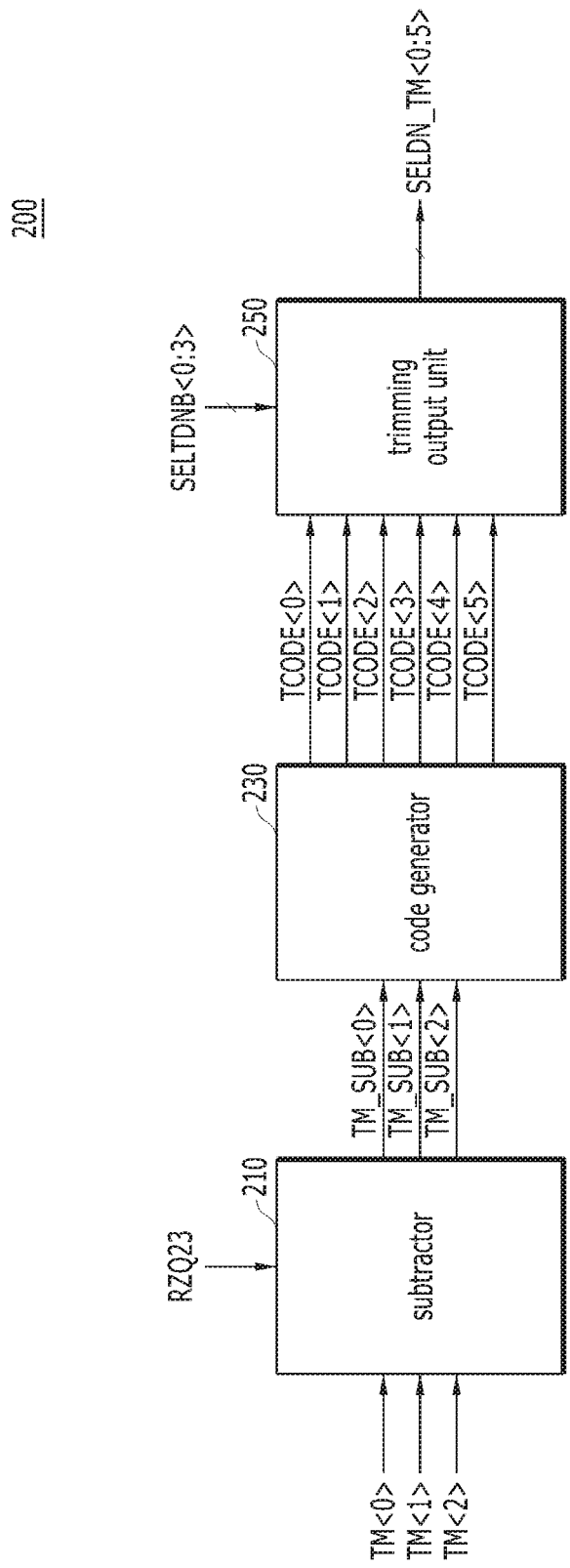
FIG. 7 is a block diagram illustrating an individual trimming controller in accordance with an embodiment of the present invention.

FIG. 7 is a block diagram illustrating an individual trimming controller in accordance with an embodiment of the present invention, for example, the individual trimming controller 200 shown in FIG. 4.

Referring to FIG. 7, the individual trimming controller 200 may include a subtractor 210, a code generator 230, and a trimming output unit 250.

The subtractor 210 may selectively subtract the test mode signals TM<0:2> based on a subtraction selecting signal RZQ23 to output subtraction mode signals TM_SUB<0:2>. The subtractor 210 may subtract the subtraction selecting signal RZQ23 from the test mode signals TM<0:2> when the subtraction selecting signal RZQ23 is of a logic high level, e.g., logic level '1', to output the subtraction mode signals TM_SUB<0:2>. The subtraction selecting signal RZQ23 may be activated when pull-down resistor groups selected based on the group selection signals SELTDNB<0:3> are not sequentially selected from the first pull-down resistor group 131.

As described above with reference to FIG. 6, the subtraction selecting signal RZQ23 may be activated when the target impedance of the pull-down termination block 130 is 120Ω or 60Ω. As shown in Table 1 below, just when the target impedance is 120Ω or 60Ω, the subtractor 210 may perform a subtraction operation on the test mode signals TM<0:2> to output the subtraction mode signals TM_SUB<0:2>.

TABLE 1

| | | TM_SUB<0:2> | | | | |
|---|---|---|---|---|---|---|
| RZQ23 | | 240 ohm 0 | 120 ohm 1 | 80 ohm 0 | 60 ohm 1 | 48 ohm 0 | 40 ohm 0 |
| TM<0:2> | 001 | 001 | 000 | 001 | 000 | 001 | 001 |
| | 010 | 010 | 001 | 010 | 001 | 010 | 010 |
| | 011 | 011 | 010 | 011 | 010 | 011 | 011 |
| | 100 | 100 | 011 | 100 | 011 | 100 | 100 |
| | 101 | 101 | 100 | 101 | 100 | 101 | 101 |
| | 110 | 110 | 101 | 110 | 101 | 110 | 110 |
| | 111 | 111 | 110 | 111 | 110 | 111 | 111 |

However, the present invention is not limited to this. When the first to sixth pull-down resistor groups 131 to 136 are sequentially selected from the first pull-down resistor group 131, the subtractor 210 may be omitted. Although it is illustrated that the subtraction selecting signal RZQ23 is inputted from an external device, the present invention is not limited thereto; the subtractor 210 may decode the group selection signals SELTDNB<0:3> to generate the subtraction selecting signal RZQ23 according to embodiments of the present invention.

The code generator 230 may decode the subtraction mode signals TM_SUB<0:2> to generate trimming codes TCODE<0:5>. The trimming codes TCODE<0:5> may include a thermometer code, i.e., a unary code. In other words, when the 6-bit trimming codes TCODE<0:5> are generated, the code generator 230 may determine the number of logic high level bits (i.e., '1') of the trimming codes TCODE<0:5> based on a value of the subtraction mode signals TM_SUB<0:2>. For example, as shown in Table 2, the code generator 230 may generate the trimming codes TCODE<0:5> of '000000' when the subtraction mode signals TM_SUB<0:2> are '111', and the code generator 230 may generate the trimming codes TCODE<0:5> in which the number of logic high level bits ('1') increases one by one whenever the value of the subtraction mode signals TM_SUB<0:2> decreases. In other words, the first to sixth pull-down resistor groups 131 to 136 to be trimmed may be selected based on the subtraction mode signals TM_SUB<0:2> or the test mode signals TM<0:2>,

TABLE 2

| TM_SUB<0:2> | TCODE<0:5> |
|---|---|
| 001 | 111111 |
| 010 | 011111 |
| 011 | 001111 |
| 100 | 000111 |
| 101 | 000011 |
| 110 | 000001 |
| 111 | 000000 |

The trimming output unit 250 may combine the trimming codes TCODE<0:5> and the group selection signals SELTDNB<0:3> to output the first to sixth individual trimming signals SELDN_TM<0:5>.

Figure 8:
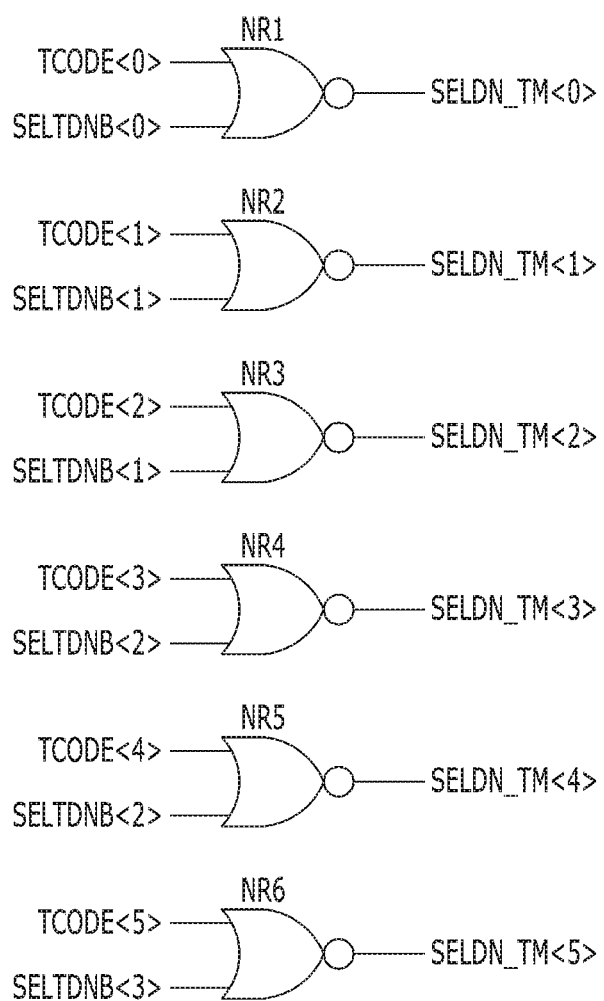
FIG. 8 is a circuit diagram illustrating a trimming output unit in accordance with an embodiment of the present invention.

FIG. 8 is a circuit diagram illustrating a trimming output unit in accordance with an embodiment of the present invention, for example, the trimming output unit 250 shown in FIG. 7.

Referring to FIG. 8, the trimming output unit 250 may include first to sixth NOR gates NR1 to NR6.

The first NOR gate NR1 may perform a NOR operation on the first bit TCODE<0> of the trimming codes TCODE<0:5> and the first bit SELTDNB<0> of the group selection signals SELTDNB<0:3> to output the first individual trimming signal SELDN_TM<0>. The second NOR gate NR2 may perform the NOR operation on the second bit TCODE<1> of the trimming codes TCODE<0:5> and the second bit SELTDNB<1> of the group selection signals SELTDNB<0:3> to output the second individual trimming signal SELDN_TM<1>. The third NOR gate NR3 may perform the NOR operation on the third bit TCODE<2> of the trimming codes TCODE<0:5> and the second bit SELTDNB<1> of the group selection signals SELTDNB<0:3> to output the third individual trimming signal SELDN_TM<2>. The fourth NOR gate NR4 may perform the NOR operation on the fourth bit TCODE<3> of the trimming codes TCODE<0:5> and the third bit SELTDNB<2> of the group selection signals SELTDNB<0:3> to output the fourth individual trimming signal SELDN_TM<3>. The fifth NOR gate NR5 may perform the NOR operation on the fifth bit TCODE<4> of the trimming codes TCODE<0:5> and the third bit SELTDNB<2> of the group selection signals SELTDNB<0:3> to output the fifth individual trimming signal SELDN_TM<4>. The sixth NOR gate NR6 may perform the NOR operation on the sixth bit TCODE<5> of the trimming codes TCODE<0:5> and the fourth bit SELTDNB<3> of the group selection signals SELTDNB<0:3> to output the sixth individual trimming signal SELDN_TM<5>.

When the two signals that are inputted have a logic low level, each of the first to sixth NOR gates NR1 to NR6 may output a corresponding individual trimming signal as a logic high level. As described above, the trimming output unit 250 may provide the first to sixth individual trimming signals SELDN_TM<0:5> for an individual trimming operation to selected groups of the first to sixth pull-down resistor groups 131 to 136.

Figure 9A:
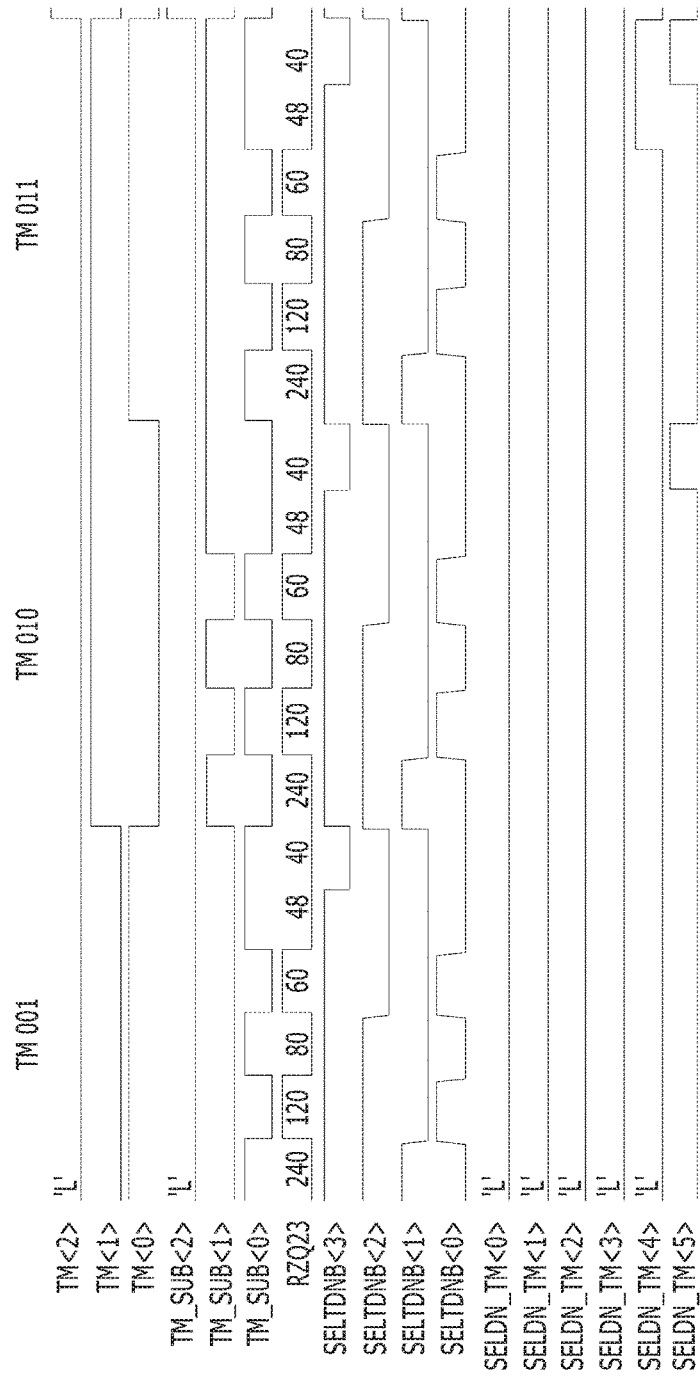
FIGS. 9A and 9B are timing diagrams illustrating an operation of an individual trimming controller in accordance with an embodiment of the present invention.
Figure 9B:
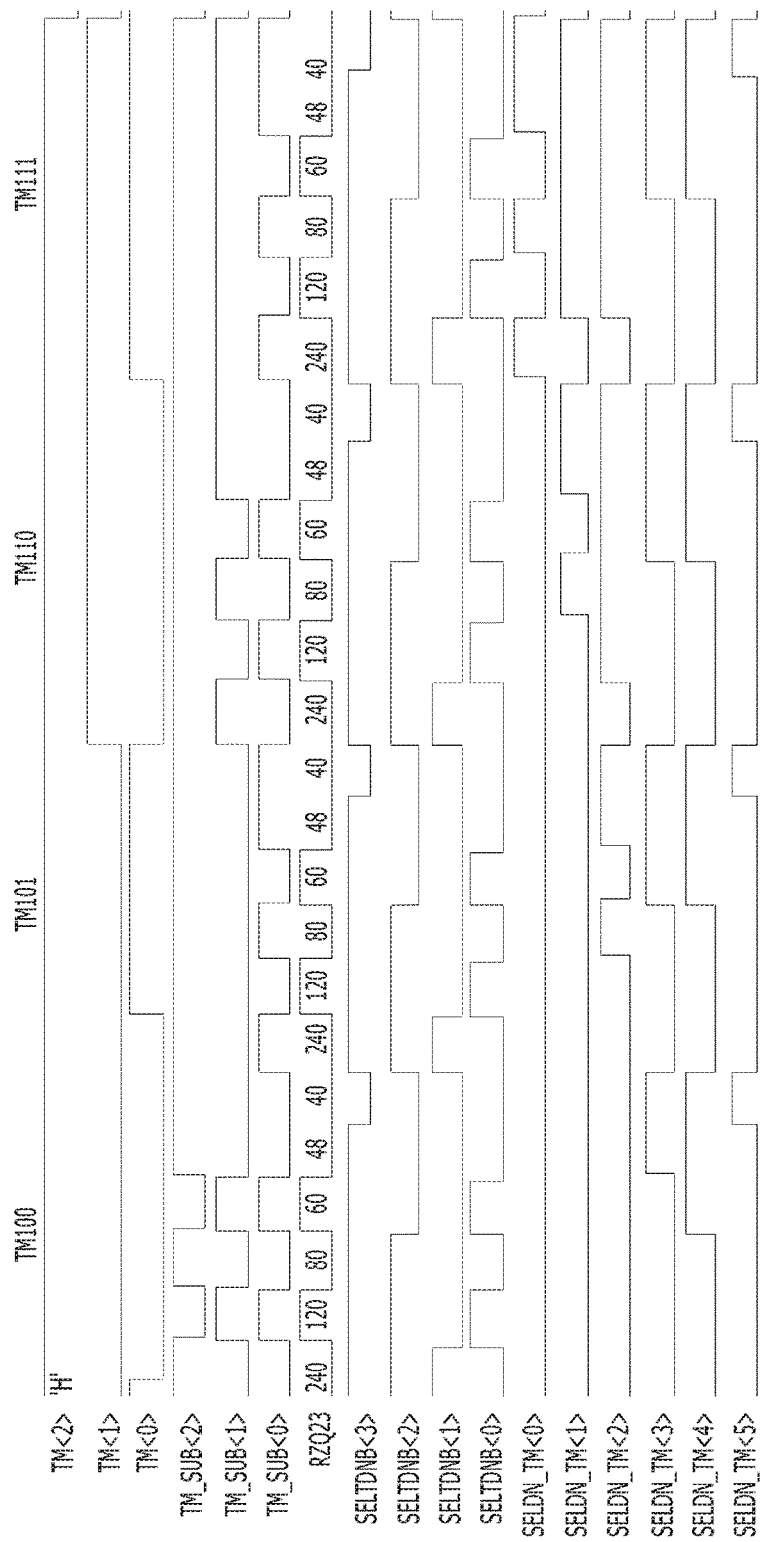

FIGS. 9A and 9B are timing diagrams illustrating an operation of an individual trimming controller in accordance with an embodiment of the present invention, for example, the individual trimming controller 200 shown in FIG. 7.

Referring to FIG. 9A, it is illustrated that the test mode signals TM<0:2> are '001', '010', and '011', respectively. As described above, when there is no pull-down resistor group to be individually trimmed, the test mode signals TM<0:2> may be set to '001'. When the sixth pull-down resistor group 136 is to be trimmed, the test mode signals TM<0:2> may be set to '010'. When the fifth and sixth pull-down resistor groups 135 and 136 are to be trimmed, the test mode signals TM<0:2> may be set to '011'. In each case, as the group selection signals SELTDNB<0:3> are sequentially set to '1110', '1101', '1100', '1001', '1000' and '0000', the target impedance may be sequentially changed to 240Ω, 120Ω, 80Ω, 60Ω, 48Ω and 40Ω.

The subtractor 210 may selectively subtract the subtraction selecting signal RZQ23 from the test mode signals TM<0:2> to output the subtraction mode signals TM_SUB<0:2>. In other words, when the target impedance is 120Ω or 60Ω, the subtraction selecting signal RZQ23 may be activated as a logic high level, and the subtractor 210 may subtract the subtraction selecting signal RZQ23 from the test mode signals TM<0:2> to output as the subtraction mode signals TM_SUB<0:2>. The code generator 230 may determine the number of logic high level bits ('1') of the trimming codes TCODE<0:5> based on the value of the subtraction mode signals TM_SUB<0:2>. The trimming output unit 250 may combine the trimming codes TCODE<0:5> and the group selection signals SELTDNB<0:3> to output the first to sixth individual trimming signals SELDN_TM<0:5>.

When the test mode signals TM<0:2> is '010' and the target impedance is 40Ω, the individual trimming controller 200 may activate and output the sixth individual trimming signal SELDN_TM<5> at a logic high level. That is, referring to FIG. 6, when the target impedance is 40Ω, just the sixth pull-down resistor group 136 may be individually trimmed.

When the test mode signals TM<0:2> are '011' and the target impedance is 48Ω, the individual trimming controller 200 may activate and output the fifth individual trimming signal SELDN_TM<4> at the logic high level. When the test mode signals TM<0:2> are '011' and the target impedance is 40Ω, the individual trimming controller 200 may activate and output the fifth and sixth individual trimming signals SELDN_TM<4:5> at the logic high level. That is, referring to FIG. 6, when the target impedance is 48Ω, the fifth pull-down resistor group 135 may be individually trimmed, and when the target impedance is 40Ω, the fifth and sixth pull-down resistor groups 135 and 136 may be individually trimmed. When the target impedance is 60Ω, the subtractor 210 may subtract the subtraction selecting signal RZQ23 from the test mode signals TM<0:2> to output, as the subtraction result, the subtraction mode signals TM_SUB<0:2> as the subtraction selecting signal RZQ23 is activated at the logic high level. Accordingly, when the target impedance is 60Ω, the individual trimming controller 200 may deactivate and output the fifth individual trimming signal SELDN_TM<4> as a logic low level so that the fifth pull-down resistor group 135 is not individually trimmed.

Referring to FIG. 9B, it is illustrated that the test mode signals TM<0:2> are '100', '101', '110' and '111', respectively. When the fourth to sixth pull-down resistor groups 134 to 136 are to be trimmed, the test mode signals TM<0:2> may be set to '100'. When the third to sixth pull-down resistor groups 133 to 136 are to be trimmed, the test mode signals TM<0:2> may be set to '101'. When the second to sixth pull-down resistor groups 132 to 136 are to be trimmed, the test mode signals TM<0:2> may be set to '110'. When the first to sixth pull-down resistor groups 131 to 136 are to be trimmed, the test mode signals TM<0:2> may be set to '111'. In each case, as the group selection signals SELTDNB<0:3> are sequentially set to '1110', '1101', '1100', '1001', '1000' and '0000', the target impedance may be sequentially changed to 240Ω, 120Ω, 80Ω, 60Ω, 48Ω and 40Ω.

When the test mode signals TM<0:2> is '101' and the target impedance is 80Ω, the individual trimming controller 200 may activate and output the third individual trimming signal SELDN_TM<2> at a logic high level. When the test mode signals TM<0:2> is '101' and the target impedance is 48Ω, the individual trimming controller 200 may activate and output the third to fifth individual trimming signals SELDN_TM<2:4> at the logic high level. When the test mode signals TM<0:2> is '101' and the target impedance is 40Ω, the individual trimming controller 200 may activate and output the third to sixth individual trimming signals SELDN_TM<2:5> at the logic high level. When the target impedance is 120Ω or 60Ω, the subtractor 210 may subtract the subtraction selecting signal RZQ23 from the test mode signals TM<0:2> to output, as the subtraction result, the subtraction mode signals TM_SUB<0:2> as the subtraction selecting signal RZQ23 is activated as the logic high level.

Accordingly, when the target impedance is 120Ω or 60Ω, the individual trimming controller 200 may deactivate and output the third individual trimming signal SELDN_TM<2> at a logic low level so that the third pull-down resistor group 133 is not individually trimmed.

When the test mode signals TM<0:2> are '111' and the target impedance is 240Ω, the trimming output unit 250 may activate and output the first individual trimming signal SELDN_TM<0> at a logic high level. When the test mode signals TM<0:2> are '111' and the target impedance is 120Ω, the trimming output unit 250 may activate and output the second and third individual trimming signals SELDN_TM<1:2> at the logic high level. When the test mode signals TM<0:2> are '111' and the target impedance is 80Ω, the trimming output unit 250 may activate and output the first to third individual trimming signals SELDN_TM<0:2> at the logic high level. When the test mode signals TM<0:2> are '111' and the target impedance is 60Ω, the trimming output unit 250 may activate and output the second to fifth individual trimming signals SELDN_TM<1:4> at the logic high level. When the test mode signals TM<0:2> are '111' and the target impedance is 48Ω, the trimming output unit 250 may activate and output the first to fifth individual trimming signals SELDN_TM<0:4> at the logic high level. When the test mode signals TM<0:2> are '111' and the target impedance is 40Ω, the trimming output unit 250 may activate and output the first to sixth individual trimming signals SELDN_TM<0:5> at the logic high level. Accordingly, when the target impedance is 120Ω or 60Ω, the individual trimming controller 200 may deactivate and output the first individual trimming signal SELDN_TM<0> at a logic low level so that the first pull-down resistor group 131 is not individually trimmed.

As described above with reference to FIGS. 9A and 9B, the individual trimming controller 200 may determine the number of pull-down resistor groups to be individually trimmed based on the test mode signals TM<0:2> and combine the determined pull-down resistor groups with pull-down resistor groups selected based on the predetermined target impedance, i.e., the group selection signals SELTDNB<0:3>, thereby generating the first to sixth individual trimming signals SELDN_TM<0:5>.

Figure 10:
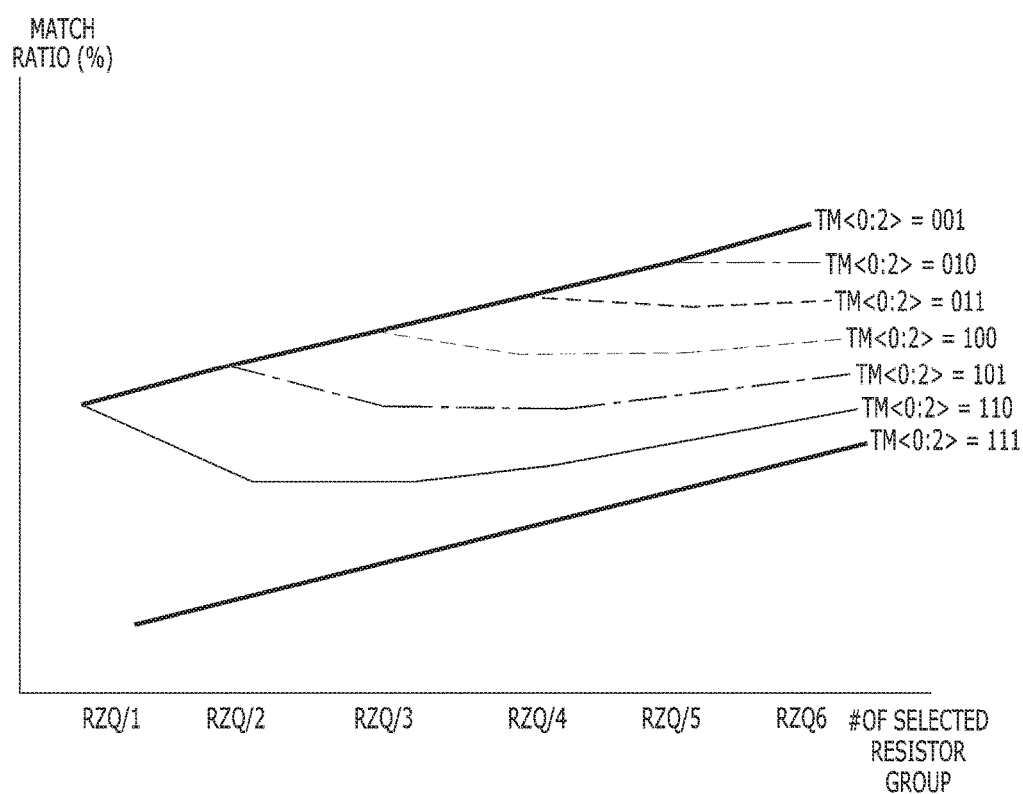
FIG. 10 is a graph illustrating a match ratio of pull-down impedance to target impedance in accordance with an embodiment of the present invention.

FIG. 10 is a graph showing a match ratio of pull-down impedance to target impedance in accordance with an embodiment of the present invention.

Referring to FIG. 10, similarly to FIG. 3, the x-axis denotes the number of selected pull-down resistor groups, and the y-axis denotes the match ratio of actual pull-down impedance to the target impedance as a percentage.

When the test mode signals TM<0:2> are '001', the pull-down resistor groups may not be individually trimmed. Accordingly, the match ratio may have a substantially similar value to that shown the match ratio in the graph of FIG. 3. When the test mode signals TM<0:2> are '010', just the sixth pull-down resistor group 136 may be individually trimmed, and thus the match ratio may be reduced only when the target impedance is 40Ω, i.e., RZQ/6. When the test mode signals TM<0:2> are '011', the fifth and sixth pull-down resistor groups 135 and 136 may be individually trimmed, and thus the match ratio may be reduced when the target impedance is 48Ω, i.e., RZQ/5 and the match ratio may be further reduced when the target impedance is 40Ω, i.e., RZQ/6. In this manner, when the test mode signals TM<0:2> are '111', all the pull-down resistor groups 131 to 136 may be trimmed, and thus the match ratio may be reduced for all of the target impedances.

As described above, the semiconductor device in accordance with an embodiment of the present invention may prevent impedance mismatch and deterioration of signal integrity (SI) characteristics by individually as well as collectively trimming the respective resistor groups of the termination circuit 100.

Figure 11:
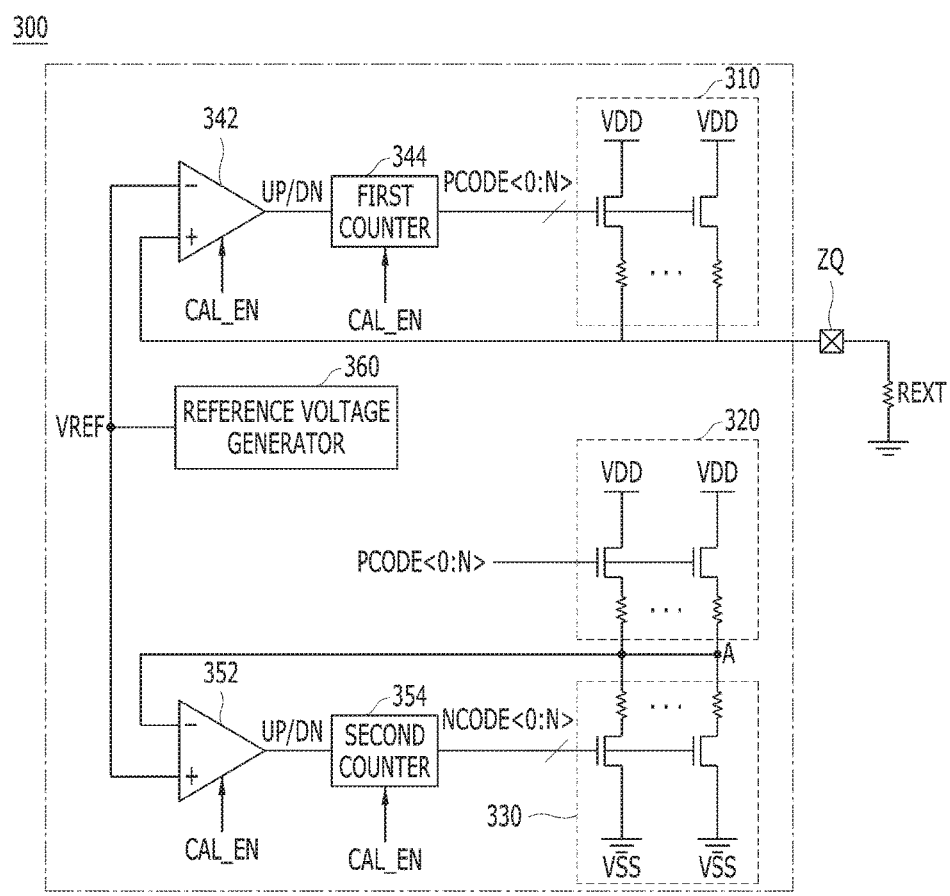
FIG. 11 is a circuit diagram illustrating a calibration circuit in accordance with an embodiment of the present invention.

FIG. 11 is a circuit diagram illustrating a calibration circuit in accordance with an embodiment of the present invention, for example, the calibration circuit 300 shown in FIG. 4.

Referring to FIG. 11, the calibration circuit 300 may include a pull-up reference resistance block 310, a dummy reference resistance block 320, a pull-down reference resistance block 330, a first comparison block 342, a second comparison block 352, a first counter 344, a second counter 354, and a reference voltage generator 360.

The first comparison block 342 may compare a voltage of the calibration pad ZQ with a reference voltage VREF. The voltage of the calibration pad ZQ may be generated by a voltage distribution of the external resistor REXT and the pull-up reference resistance block 310. The reference voltage VREF may be generated from the reference voltage generator 360. The first comparison block 342 may generate up/down signals UP/DN based on a result of the comparison. In general, the reference voltage VREF may be set to "VDD/2".

The first counter 344 may generate the pull-up control codes PCODE<0:N> in response to the up/down signals UP/DN.

The pull-up reference resistance block 310 may include a plurality of pull-up resistors coupled in parallel to each other, which are turned on/off in response to the pull-up control codes PCODE<0:N>. The pull-up reference resistance block 310 may adjust impedance by turning on/off the pull-up resistors, each of which impedance is designed to correspond to a binary weight, based on the pull-up control codes PCODE<0:N>. The adjusted impedance of the pull-up reference resistance block 310 may affect the voltage of the calibration pad ZQ again, and then the foregoing operation may be repeated. Consequently, a calibration operation may be repeatedly performed until the impedance of the pull-up reference resistance block 310 becomes equal to impedance of the external resistor REXT. Such an operation may be defined as a pull-up calibration operation. The pull-up reference resistance block 310, which is designed similarly to the pull-up termination block 110 of FIG. 4 that drives the data pad DQ, may have the same or a similar tendency to the pull-up termination block 110.

The dummy reference resistance block 320 may be configured in the same manner as the pull-up reference resistance block 310. The pull-down reference resistance block 330 may include a plurality of pull-down resistors coupled in parallel to each other, which are turned on/off in response to the pull-down control codes NCODE<0:N>. The pull-down reference resistance block 330, which is designed similarly to the pull-down termination block 130 of FIG. 4, is may have the same or a similar tendency to the pull-down termination block 130.

The pull-up control codes PCODE<0:N> generated through the pull-up calibration operation may be inputted to the dummy reference resistance block 320 to determine impedance of the dummy reference resistance block 320. Similarly to the pull-up calibration operation, a calibration operation may be repeatedly performed until a voltage of a node "A" becomes equal to the reference voltage VREF, that is, impedance of the pull-down reference resistance block 330 becomes equal to the impedance of the dummy reference resistance block 320, through the second comparison block 352 and the second counter 354. Such an operation may be defined as a pull-down calibration operation.

The pull-up control codes PCODE<0:N> and pull-down control codes NCODE<0:N> generated as a result of the ZQ calibration operation including the pull-up calibration operation and the pull-down calibration operation may be inputted to the termination circuit 100 shown in FIG. 4 to adjust impedance.

The calibration circuit 300 does not always operate; rather, it operates only during a set period to perform the calibration operation, which period may be predetermined. To this end, the calibration circuit 300 may receive the calibration enable signal CAL_EN for performing the calibration operation. When the calibration enable signal CAL_EN is activated, the first and second comparison blocks 342 and 352 and the first and second counters 344 and 354 may operate. When the calibration enable signal CAL_EN is deactivated, the first and second comparison blocks 342 and 352 and the first and second counters 344 and 354 may not operate. Accordingly, the pull-up control codes PCODE<0:N> and the pull-down control codes NCODE<0:N> do not change, either.

In accordance with embodiments of the present invention, the semiconductor device is configured to prevent impedance mismatch and deterioration of signal integrity (SI) characteristics by individually trimming the respective resistor groups of the termination circuit.

While the present invention has been described with respect to specific embodiments, these embodiments are not intended to be restrictive, but rather descriptive. Further, it is noted that the present invention may be achieved or implemented in various ways through substitution, change, and modification, as those skilled in the art would understand in light of the present disclosure, without departing from the spirit and/or scope of the present invention as defined by the following claims.

For example, dispositions and types of the logic gates and transistors described in the aforementioned embodiments may be implemented differently based on the polarity of the inputted signal.

What is claimed is:

1. A semiconductor device, comprising:
   a calibration circuit suitable for generating impedance control codes based on an external resistor coupled to a calibration pad;
   an individual trimming controller suitable for generating a plurality of individual trimming signals based on test mode signals and group selection signals; and
   a termination circuit including a plurality of resistor groups, coupled in parallel to a data pad, that are trimmed as a group based on the impedance control codes, wherein the plurality of individual trimming signals respectively correspond to the plurality of resistor groups, and each of the plurality of resistor groups is individually trimmed based on a corresponding individual trimming signal.

2. The semiconductor device of claim 1, wherein each of the plurality of resistor groups includes:
   a plurality of first trimming transistors that are coupled in parallel to the data pad and are turned on based on respective bits of the impedance control codes; and
   a second trimming transistor that is coupled in parallel to the data pad and is turned on based on the corresponding signal among the plurality of individual trimming signals.

3. The semiconductor device of claim 1, wherein the termination circuit further includes:
a plurality of coupling units that are coupled between the plurality of resistor groups and the data pad, respectively, each of the plurality of coupling units being turned on based on a corresponding signal among a plurality of target signals,
wherein impedance of the data pad is adjusted based on the number of coupling units which are turned on among the plurality of coupling units.

4. The semiconductor device of claim 1, wherein the individual trimming controller includes:
a subtractor suitable for subtracting subtraction selecting signals from the test mode signals to generate and output subtraction mode signals;
a code generator suitable for decoding the subtraction mode signals to generate trimming codes including thermometer codes; and
a trimming output unit suitable for combining the trimming codes and the group selection signals to output the plurality of individual trimming signals.

5. The semiconductor device of claim 4,
wherein the group selection signals are for selecting at least one of the plurality of resistor groups based on target impedance,
wherein the subtraction selecting signals are activated when resistor groups selected based on the group selection signals are not sequentially selected from a first resistor group among the plurality of resistor groups.

6. The semiconductor device of claim 4, wherein the code generator determines the number of logic high level bits in the trimming codes based on a value of the subtraction mode signals.

7. The semiconductor device of claim 4, wherein the trimming output unit includes:
a plurality of logic gates suitable for performing logic NOR operations on corresponding bit pairs of the trimming codes and the group selection signals respectively to output the plurality of individual trimming signals.

8. A termination circuit, comprising:
a pull-up termination block including a plurality of pull-up resistor groups that are coupled in parallel to each other between a data pad and a terminal for a power source voltage and are trimmed as a group based on pull-up control codes; and
a pull-down termination block including a plurality of pull-down resistor groups that are coupled in parallel to each other between the data pad and a terminal for a ground voltage and are trimmed as a group based on pull-down control codes, each of the plurality of pull-down resistor groups being individually trimmed based on a corresponding signal among a plurality of individual trimming signals which respectively correspond to the plurality of pull-up resistor groups and the plurality of pull-down resistor groups.

9. The termination circuit of claim 8, wherein each of the plurality of pull-up resistor groups includes:
a plurality of first trimming transistors that are coupled in parallel to each other between the data pad and the terminal for the power source voltage and are turned on based on respective bits of the pull-up control codes.

10. The termination circuit of claim 8, wherein each of the plurality of pull-down resistor groups includes:
a plurality of second trimming transistors that are coupled in parallel to each other between the data pad and the terminal for the ground voltage and are turned on based on respective bits of the pull-down control codes; and
a third trimming transistor that is coupled in parallel between the data pad and the terminal for the ground voltage and is turned on based on the corresponding signal among the plurality of individual trimming signals.

11. The termination circuit of claim 8, further comprising:
a plurality of pull-up coupling blocks that are coupled between the plurality of pull-up resistor groups and the data pad, each of the plurality of pull-up coupling blocks being turned on based on a corresponding signal among a plurality of pull-up target signals; and
a plurality of pull-down coupling blocks that are coupled between the plurality of pull-down resistor groups and the data pad, each of the plurality of pull-down coupling blocks being turned on based on a corresponding signal among a plurality of pull-down target signals,
wherein impedance of the data pad is adjusted based on the number of pull-up and pull-down coupling blocks which are turned on among the plurality of pull-up and pull-down coupling blocks.

12. The termination circuit of claim 8, further comprising:
an individual trimming control block suitable for generating the plurality of individual trimming signals, activation numbers of which are adjusted based on group selection signals for selecting at least one of the plurality of pull-down resistor groups and test mode signals.

13. The termination circuit of claim 12, wherein the individual trimming control block includes:
a subtractor suitable for subtracting subtraction selecting signals from the test mode signals to generate and output subtraction mode signals;
a code generator suitable for decoding the subtraction mode signals to generate trimming codes including thermometer codes; and
a trimming output unit suitable for combining the trimming codes and the group selection signals to output the plurality of individual trimming signals.

14. The termination circuit of claim 13, wherein the subtraction selecting signals are activated when resistor groups selected based on the group selection signals are not sequentially selected from a first resistor group among the plurality of pull-down resistor groups.

15. The termination circuit of claim 13, wherein the code generator determines the number of logic high levels bits in the trimming codes based on a value of the subtraction mode signals.

16. The termination circuit of claim 13, wherein the trimming output unit includes:
a plurality of logic gates suitable for performing logic NOR operations on corresponding bit pairs of the trimming codes and the group selection signals respectively to output the plurality of individual trimming signals.

17. A termination circuit, comprising:
a pull-up termination block including a plurality of pull-up resistor groups that are coupled in parallel to each other between a data pad and a terminal for a power source voltage and are trimmed based on pull-up control codes; and
a pull-down termination block including a plurality of pull-down resistor groups that are coupled in parallel to each other between the data pad and a terminal for a ground voltage and are trimmed based on pull-down control codes, wherein one or more resistor groups selected from the pull-up and pull-down termination blocks are individually trimmed based on one or more corresponding signals among a plurality of individual trimming signals which respectively correspond to the plurality of pull-up resistor groups and the plurality of pull-down resistor groups.

18. The termination circuit of claim 17, wherein each resistor group selected from the pull-up and pull-down termination blocks includes:
   a plurality of first trimming transistors that are turned on based on respective bits of the pull-up and pull-down control codes; and
   a second trimming transistor that is turned on based on a corresponding signal among the plurality of individual trimming signals.

19. The termination circuit of claim 17, further comprising:
   an individual trimming control block suitable for generating the plurality of individual trimming signals, activation numbers of which are adjusted based on group selection signals for selecting at least one of the plurality of pull-down resistor groups and test mode signals according to a target impedance.

20. The termination circuit of claim 19, wherein the individual trimming control block includes:
   a subtractor suitable for subtracting subtraction selecting signals from the test mode signals to generate and output the subtracting result as subtraction mode signals, wherein the subtraction selecting signals are activated when resistor groups selected based on the group selection signals are not sequentially selected from a first resistor group;
   a code generator suitable for determining and generating the number of logic high level bits in trimming codes based on a value of the subtraction mode signals; and
   a trimming output unit suitable for combining the trimming codes and the group selection signals to output the plurality of individual trimming signals.

\* \* \* \* \*